(12) United States Patent
Kawaguchi et al.

(10) Patent No.: US 9,808,985 B2
(45) Date of Patent: Nov. 7, 2017

(54) ROLLER PRESSING DEVICE, IMPRINTING DEVICE, AND ROLLER PRESSING METHOD

(71) Applicant: SCIVAX CORPORATION, Kanagawa (JP)

(72) Inventors: Hirosuke Kawaguchi, Tokyo (JP); Yutaka Taniguchi, Kanagawa (JP); Satoru Tanaka, Tokyo (JP)

(73) Assignee: SCIVAX CORPORATION, Kanagawa (JP)

( * ) Notice: Subject to any disclaimer, the term of this patent is extended or adjusted under 35 U.S.C. 154(b) by 338 days.

(21) Appl. No.: 14/400,824

(22) PCT Filed: Jun. 19, 2013

(86) PCT No.: PCT/JP2013/066836
§ 371 (c)(1),
(2) Date: Nov. 13, 2014

(87) PCT Pub. No.: WO2013/191206
PCT Pub. Date: Dec. 27, 2013

(65) Prior Publication Data
US 2015/0217506 A1   Aug. 6, 2015

(30) Foreign Application Priority Data

Jun. 21, 2012  (JP) ................. 2012-140236

(51) Int. Cl.
*B29C 59/04* (2006.01)
*B29C 35/08* (2006.01)
(Continued)

(52) U.S. Cl.
CPC .......... *B29C 59/04* (2013.01); *B29C 35/0805* (2013.01); *B29C 2059/023* (2013.01); *B29L 2007/001* (2013.01); *G03F 7/0002* (2013.01)

(58) Field of Classification Search
CPC ................ B29C 35/0805; B29C 59/04; B29C 2059/023; G03F 7/0002
See application file for complete search history.

(56) References Cited

U.S. PATENT DOCUMENTS

2002/0098257 A1* 7/2002 Ikeda .................... B29C 59/046
                                                          425/374
2010/0052216 A1* 3/2010 Kim ....................... B29C 59/02
                                                          264/284
2013/0139712 A1   6/2013 Lee et al.

FOREIGN PATENT DOCUMENTS

JP       2001-058352 A    3/2001
JP       2013-119254 A    6/2013

* cited by examiner

*Primary Examiner* — James Mackey

(57) ABSTRACT

A roller-type depressing device, an imprint device and an imprint method utilizing the same which can depress an object like a die or a molding target by controlling the depressing force of a roller is provided. A roller-type depressing device to depress the object with a roller includes a pressure adjusting plate provided with the roller, a roller moving unit moving the roller relative to the object, a pressure adjusting unit holding the pressure adjusting plate in such a way that force produced by a pressure difference in fluid applied to both faces of the pressure adjusting plate acts on the roller, a pressure receiving stage receiving the pressure of the roller via the object, and a pressure adjuster adjusting the pressure difference in fluid applied to both faces of the pressure adjusting plate.

8 Claims, 5 Drawing Sheets

(51) Int. Cl.
*G03F 7/00* (2006.01)
*B29C 59/02* (2006.01)
*B29L 7/00* (2006.01)

ROLLER PRESSING DEVICE, IMPRINTING DEVICE, AND ROLLER PRESSING METHOD

RELATED APPLICATIONS

This application is a national phase of International Patent Application No. PCT/JP2013/066836, filed Jun. 19, 2013, which claims the filing benefit of Japanese Patent Application No. 2012-140236, filed Jun. 21, 2012, the contents of both of which are incorporated herein by reference.

TECHNICAL FIELD

The present disclosure relates to a roller-type depressing device, an imprint device, and a roller-type depressing method to depress an object with a roller.

BACKGROUND ART

Conventionally, a nano-imprinting technology is known to form a micropattern in a micro order or a nano order. This technology is to depress a die with a micropattern against a molding target like a resin, and to transfer the pattern to the molding target by heat or light (see, for example, Patent Literature 1). In addition, an imprint device is also known which depresses a flexible die with a fluid pressure in order to increase the transfer area (see, for example, Patent Literature 2).

CITATION LIST

Patent Literature

Patent Literature 1: WO2004/062886
Patent Literature 2: JP 2009-154393 A

SUMMARY OF THE INVENTION

Technical Problem

When a molding target layer formed of a photo-curable resin is applied on a substrate, the molding target layer has unevenness in the thickness. When this molding target layer is depressed with a die that is a rigid body, the molding target layer can be made uniform at the time of molding, but it is difficult to increase the transfer area. Conversely, when a flexible die is depressed with a fluid pressure as explained above, the pressure is uniform throughout all locations. Hence, there is not space to retract air present between the resin and the die or the molding target layer, resulting in a difficulty of eliminating the unevenness of the resin and the air.

In order to address this technical problems, a scheme of making the resin layer uniform with a roller is possible, but in the cases of technologies depressing the roller and the die against the molding target through a position control technology, it is difficult to control the depressing force because of, for example, the circularity of the roller.

Hence, it is an objective of the present disclosure to provide a roller-type depressing device that can depress an object like a die or a molding target by controlling the depressing force of a roller, an imprint device and an imprint method employing the same.

Solution to Problem

To accomplish the above objective, a roller-type depressing device according to the present disclosure depresses an object with a roller, and the device includes: a pressure adjusting plate provided with the roller; a roller moving unit that moves the roller relative to the object; a pressure adjusting unit that holds the pressure adjusting plate in such a way that a force produced by a pressure difference in fluid applied to both faces of the pressure adjusting plate acts on the roller; a pressure receiving stage that receives pressure of the roller via the object; and a pressure adjuster that adjusts the pressure difference in fluid applied to both faces of the pressure adjusting plate.

In this case, the pressure adjusting plate may be provided with the roller moving unit. The pressure adjuster may include a first-pressure-adjusting-room component forming a first pressure adjusting room together with the pressure adjusting plate. In addition, the pressure adjuster may include a depressurizer that depressurizes the first pressure adjusting room. Still further, the pressure adjuster may include a pressurizer that pressurizes the first pressure adjusting room.

The first-pressure-adjusting-room component may be a cylindrical first frame that forms the first pressure adjusting room together with the object or the pressure receiving stage and the pressure adjusting plate.

An imprint device according to the present disclosure includes the aforementioned roller-type depressing device. In this case, the imprint device may further include a light source which moves together with the roller and which emits light to the object.

A roller-type depressing method according to the present disclosure is to depress an object with a roller, and the method includes: a disposing process of disposing the object on a pressure receiving stage; a pressure adjusting process of adjusting pressure applied to the object by the roller by utilizing a pressure difference in fluid applied to both faces of a pressure receiving plate that supports the roller; and a depressing process of moving the roller relative to the object, and depressing the object by the roller.

In this case, the pressure adjusting plate may be provided with a roller moving unit that moves the roller. In addition, the pressure adjusting process may depressurize a first pressure adjusting room formed by the pressure adjusting plate.

The roller-type depressing method of the present disclosure is applicable to imprinting. In this case, the object may include a die and a molding target both applied to imprinting, and the method may further include, prior to the disposing process, a depressurizing process of depressurizing an atmosphere between the die and the molding target. In addition, the method may further include, between the depressurizing process and the pressurizing process, an intimate contact process of causing the die and the molding target to intimately contact with each other by uniformly pressurizing the die and the molding target by a fluid pressure. Still further, the method may further include, before the pressurizing process, a fluid pressurizing process of pressurizing the die and the molding target by a fluid.

Advantageous Effects of Invention

The roller-type depressing device, imprint device, and roller-type depressing method of the present disclosure utilize a fluid pressure to depress an object with the roller. Hence, the die and the molding target can be depressed at a constant pressure. In addition, a molding pressure can be easily controlled.

It is to be understood that the aspects and objects of the present invention described above may be combinable and

DESCRIPTION OF EMBODIMENTS

Figure 1:
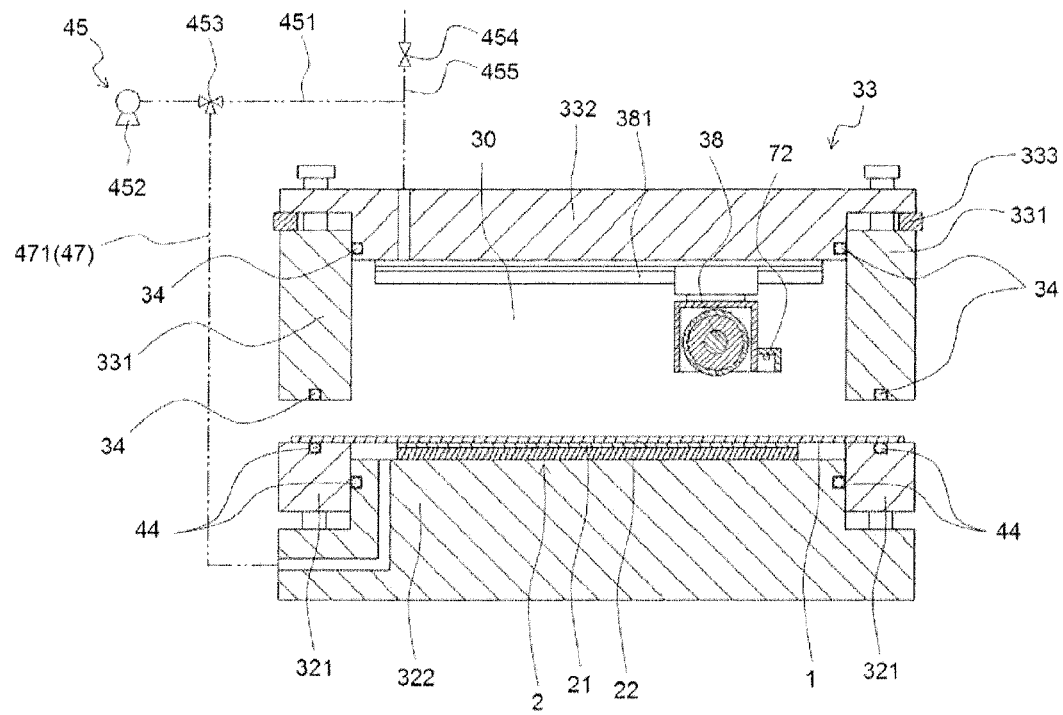
FIG. 1 is an end-face diagram illustrating an imprint device of the present disclosure.

While this invention is susceptible of embodiment in many different forms, there is shown in the drawings and will herein be described in detail one or more embodiments with the understanding that the present disclosure is to be considered as an exemplification of the principles of the invention and is not intended to limit the invention to the embodiments illustrated.

A roller-type depressing device of the present disclosure is to depress an object with a roller 38, and mainly includes a pressure adjusting plate 332 provided with the roller 38, a roller moving unit 381 that moves the roller 38 relative to the object, a pressure adjusting unit that holds the pressure adjusting plate 332 in such a way that force produced by a pressure difference in fluid applied to both faces of the pressure adjusting plate 332 acts on the roller 38, a pressure receiving stage 322 receiving the roller pressure via the object, and a pressure adjuster 45 that adjusts the pressure difference in fluid applied to both faces of the pressure adjusting plate 332.

Note that in this specification, the term object means one depressed by the roller 38, but is not necessary as being a single component, and may be multiple components. When, for example, the roller-type depressing device of the present disclosure is built in an imprint device, the object means both die 1 and molding target 2. In addition, the purpose to depress the object is not limited to a deformation of the object. For example, the depressing may be performed to repel air present between the die 1 and the molding target 2. In the following explanation, it is presumed that the roller-type depressing device of the present disclosure is built in an imprint device, and the object is a die and a molding target both utilized in imprinting.

The die 1 is formed of, for example, a "metal like nickel", "ceramics", a "carbon material like glass-like carbon", or "silicon", and has a predetermined mold pattern formed on one face (molding face). This mold pattern can be formed by applying precise machining process to the molding face. In addition, the mold pattern can be formed by applying semiconductor microfabrication technology like etching to a silicon substrate, etc., or by applying an electroforming technique like nickel plating to the surface of the silicon substrate to form a metal plating layer, and by peeling this metal plating layer. Still further, a resin-made die formed through an imprint technology is also applicable. In this case, the die may be formed as a flexible film relative to the molding target surface of the molding target 2. Needless to say, the material of the die 1 and the production scheme thereof are not limited to any particular ones as long as it can transfer a mold pattern.

The mold pattern formed on the die 1 is not limited to a geometrical shape with concavities and convexities, but includes a transfer of a predetermined surface condition like a transfer of a mirror condition with a predetermined surface roughness. In addition, the mold pattern can be formed in various sizes such that the minimum dimension of the width of the concavity and that of the convexity in the planar direction is equal to or smaller than 100 μm, equal to or smaller than 10 μm, equal to or smaller than 2 μm, equal to or smaller than 1 μm, equal to or smaller than 100 nm, and equal to or smaller than 10 nm. Still further, the dimension in the depthwise direction can be also formed in various sizes, such as equal to or larger than 10 nm, equal to or larger than 100 nm, equal to or larger than 200 nm, equal to or larger than 500 nm, equal to or larger than 1 μm, equal to or larger than 10 μm, and equal to or larger than 100 μm.

The molding target 2 means one including a substrate 22 formed of a resin, an inorganic compound or a metal, and a film molding target layer 21 with fluidity formed on the substrate or the film, but may be simply a substrate itself or a flexible film. The molding target layer 21 with fluidity may be formed on the die 1, and the molding target layer may be joined with the substrate when the substrate and the die 1 are depressed. An example material of the molding target 2 is a photo-curable resin, a thermosetting resin, or a thermoplastic resin.

Example photo-curable resin or thermosetting resin is epoxide-containing compounds, (metha)acrylate ester compounds, or unsaturated hydrocarbon-radial containing compounds of vinyl radial and allyl radial, such as vinyl ether compounds, bisallylnadimide compounds. In this case, for the purpose of a thermal polymerization, a polymerization reaction radial containing compound can be applied in solo, or an initiator with a thermal reactivity may be added to improve the thermal curing. In addition, a photoreactive initiator may be added to let a polymerization reaction advanced upon irradiation with light, thereby forming a mold pattern. Example radial initiators with a thermal reactivity suitable are organic peroxide and azo compound, and example photoreactive radial initiators suitable are acetophenone derivative, benzophenone derivative, benzoin ether derivative, and xanthone derivative. The reactive monomer may be utilized in a solventless form, or may be dissolved in a solvent and desolvated after application.

Example thermoplastic resins are olefin-based resins, such as cyclic-olefin ring-open polymer/hydrogen added substance (COP) and cyclic-olefin copolymer (COC), an acrylic resin, polycarbonate, a vinyl-ether resin, fluorine resins, such as perfluoroalkoxyalkane (PFA) or polytetrafluoroethylene (PTFE), polystyrene, a polyimide-based resin, and a polyester-based resin.

In FIG. 1, the molding target 2 is disposed at the pressure-receiving-stage-322 side, while the die 1 is disposed at the roller-38 side, but the die 1 may be disposed at the pressure-receiving-stage-322 side, while the molding target 2 may be disposed at the roller-38 side. In addition, in the die 1 and the molding target 2, it is preferable that the one disposed at the roller-38 side should be formed as a flexible film.

The roller 38 is formed in, for example, a cylindrical shape, holds the die 1 and the molding target 2 that are the objects together with the pressure receiving stage 322, and depresses those objects. The roller 38 is rotatable, and when the roller moving unit 381 moves the roller 38, the rolling roller 38 depresses the die 1 and the molding target 2. The material of the roller 38 is not limited to any particular one, but when, for example, the roller is applied to an imprinting process, it is desirable that the material should have the pressure resistance and the heat resistance under the molding condition. In addition, in order to surely apply pressure, an elastically deformable material within a suitable range is also applicable, and for example, a urethane resin is applicable. In this case, the thickness can be set as needed, but in the case of a urethane resin, the thickness may be set to substantially 5 to 10 mm.

The pressure adjusting plate 332 is provided with the roller 38, and applies force produced by a pressure difference in fluid applied to both faces of the pressure adjusting plate to the roller. The material of the pressure adjusting plate 332 is not limited to any particular one as long as it can match the molding condition, but for example, a metal like stainless-steel is applicable.

The roller moving unit 381 moves the roller 38 relative to the die 1 and the molding target 2 that are the objects, and depresses the whole molding face of the die 1 against the molding target 2. The roller moving unit 381 can be constituted by, for example, a roller casing that supports both ends of the roller, a screw provided in the roller casing and converting a rotational motion into a linear motion, an electric motor turning the screw, and guide rails provided on the pressure adjusting plate 332, and guiding the roller casing. The roller moving unit 381 may be a manual mechanism to turn the screw by a handle.

The pressure adjusting unit holds the pressure adjusting plate 332 in such a way that force produced by a pressure difference in fluid applied to both faces of the pressure adjusting plate 332 acts on the object through the roller 38. The pressure adjusting unit includes a first pressure-adjusting-room component that forms a first pressure adjusting room together with the pressure adjusting plate 332. For example, as illustrated in FIGS. 1 to 6, a first frame 331 (first pressure-adjusting-room component) and the pressure adjusting plate 332 form a casing 33 in a cylindrical shape with a bottom and an opened portion. Next, when the opened portion of the casing 33 is closed by the molding target 2 or the pressure receiving stage 322, the first pressure adjusting room 30 that is a sealed space is formed. At this time, as to the first frame 331 and the pressure adjusting plate 332, the pressure adjusting plate 332 is freely movable relative to the first frame 331 by a pressure difference in fluid applied to both faces of the pressure adjusting plate 332. For example, as illustrated in FIG. 1, the first frame 331 is formed as a rectangular cylinder having a hole serving as the opened portion of the casing 33 and having a dimension so as to be able to abut the stage 322. Such a hole (opened portion) is formed larger than at least the molding face of the die 1. In addition, the pressure adjusting plate 332 is formed in a shape having a convexed cross-section constructed by a pressure-adjusting-plate main body fittable with the hole of the first frame 331, and a flange extending horizontally from the pressure-adjusting-plate main body and abutting the first frame 331. When the pressure adjusting unit is constructed as explained above, since the pressure adjusting plate 332 is freely movable relative to the first frame 331, force produced by a pressure difference in fluid applied to both faces of the pressure adjusting plate 332 can be applied to the roller 38. Although the position of the roller 38 is changed due to the circularity of the roller 38 and the distortion of the device, etc., the pressure adjusting plate 332 can freely move in accordance with such an event. Hence, a constant fluid pressure can be applied to the roller 38. Note that the material of the first frame 331 and that of the pressure adjusting plate 332 are not limited to any particular ones as long as those have the pressure resistance and the heat resistance under the molding condition during an imprinting process, and for example, a metal like stainless-steel is applicable.

In order to surely seal the first pressure adjusting room 30, a first pressure adjusting room sealer 34 to intimately seal a space between the first frame 331 and the pressure adjusting plate 332 and a space between the first frame 331 and the die 1 or the molding target 2 may be further provided. For example, as illustrated in FIG. 1, the first pressure adjusting room sealer 34 that is an O-ring is prepared, a concave groove shallower than the diameter of the cross-section of the O-ring is formed in the side end of the pressure receiving stage, and the O-ring can be disposed in this groove. In addition, a concave groove shallower than the diameter of the cross-section of the O-ring may be formed in the outer circumference of the pressure adjusting plate 332 contacting the first frame 331, and the O-ring may be disposed in this groove. Needless to say, a concave groove shallower than the diameter of the cross-section of the O-ring may be formed in the inner circumference of the first frame 331 contacting the pressure adjusting plate 332, and the O-ring may be disposed in this groove.

It is not illustrated in the figure, but it is preferable that a first moving unit that moves the pressure receiving stage close to or distant from the casing 33 should be provided. An example first moving unit is a hydraulic or pneumatic cylinder that moves the first frame 331, or a combination of an electric motor and a ball screw that move the first frame.

Figure 7:
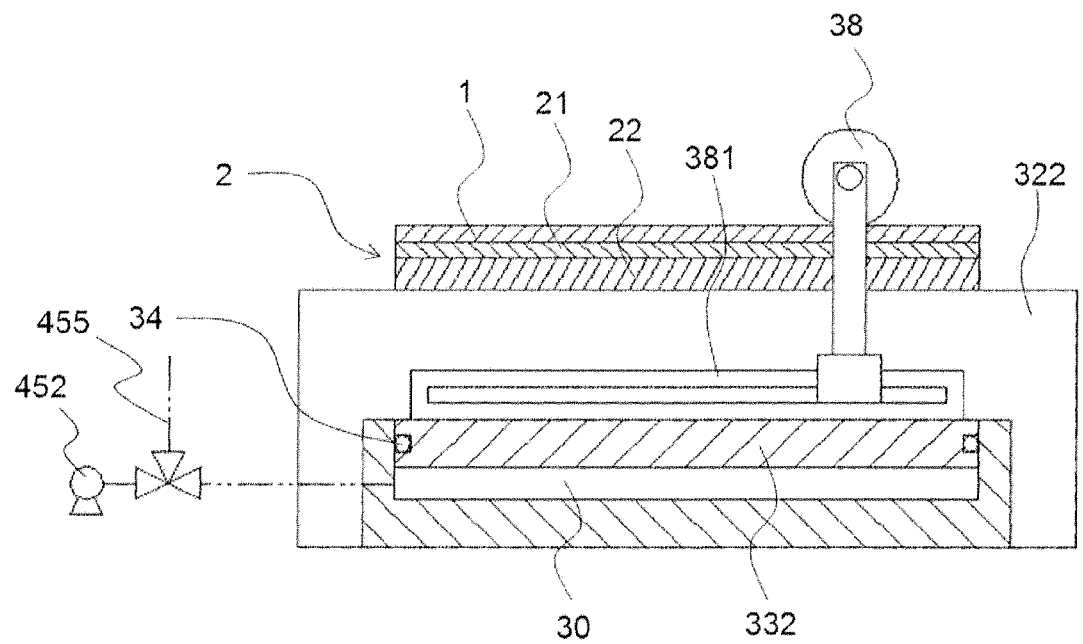
FIG. 7 is an end-face diagram illustrating another imprint device of the present disclosure.
Figure 8:
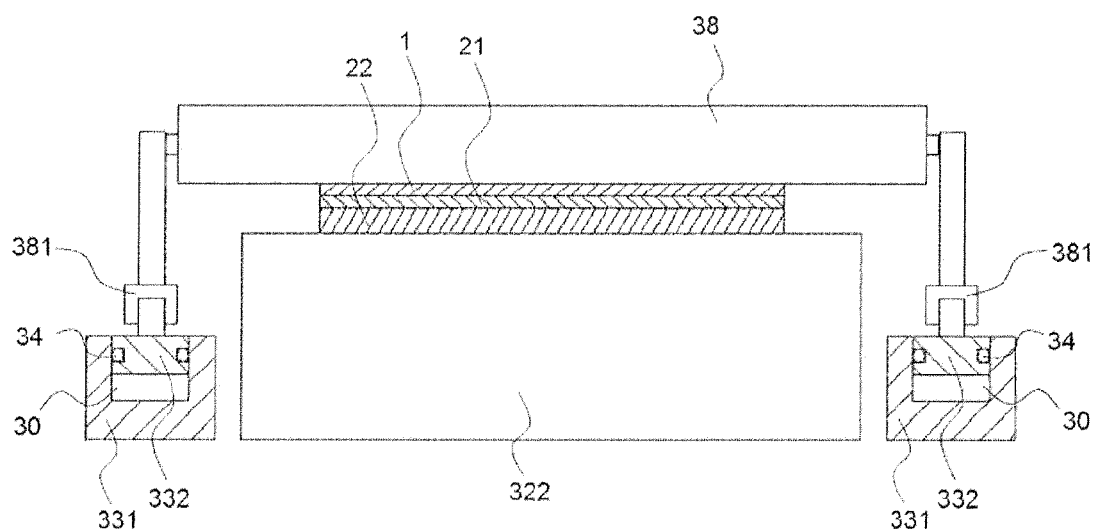
FIG. 8 is an end-face diagram illustrating another imprint device of the present disclosure.

The pressure adjusting unit is not limited to the above-explained example, and for example, as illustrated in FIGS. 7 and 8, the pressure adjusting room 30 may be disposed below the die 1 and the molding target 2. In this case, when the interior of the pressure adjusting room 30 is depressurized to produce a pressure difference between both faces of the pressure adjusting plate 332, the roller 38 can be pressed against the die 1 and the molding target 2. According to this structure, since the roller 38 and the roller moving unit 381 are disposed outside the pressure adjusting room 30, the volume of the pressure adjusting room 30 can be reduced. Hence, the amount of gas discharged at the time of depressurization can be reduced, thereby improving a throughput.

Figure 9:
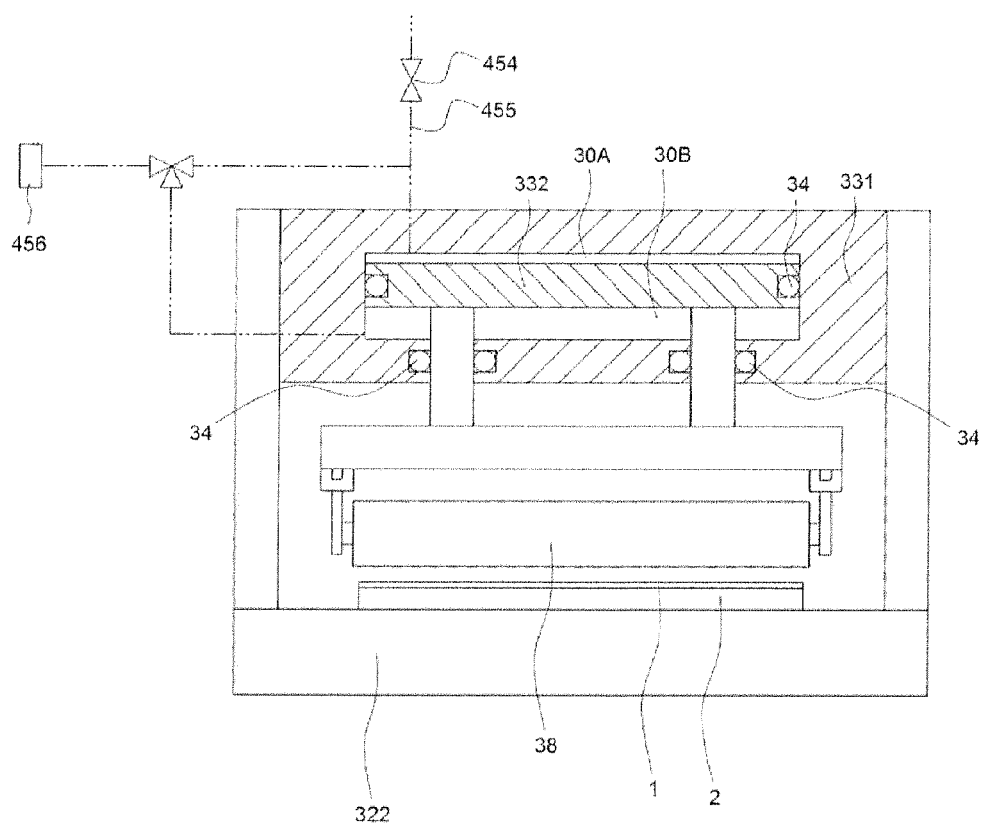
FIG. 9 is an end-face diagram illustrating the other imprint device of the present disclosure.

In addition, as illustrated in FIG. 9, pressure adjusting rooms 30A, 30B may be provided at both faces of the pressure adjusting plate 332. In this case, by producing a pressure difference between both faces of the pressure adjusting plate 332 using a pressure adjuster 45, it becomes possible not only to allow the roller to depress, but also to ascend/descend the roller. However, one pressurizing the interior of the pressure adjusting room 30 often needs a structure to support reactive force at the time of pressurization, and thus the larger the pressurizing force is, the more the device increases its size and costs. Hence, in view of this point, it is preferable to depressurize the interior of the pressure adjusting room 30 as a scheme of producing a pressure difference between both faces of the pressure adjusting plate 332.

The pressure receiving stage 322 receives the pressure by the roller via the objects that are the die 1 and the molding target 2. In the pressure receiving stage 322, the pressure receiving face that is a surface contacting the die 1 or the molding target 2 is formed so as to be sufficiently large and smooth. This pressure receiving face can be formed in a planar shape or a curved shape in accordance with the shape of the die 1 and that of the molding target 2 to be supported. The material is not limited to any particular one as long as it has the pressure resistance and the heat resistance under a molding condition in an imprinting process, and for example, a metal like stainless-steel is applicable. When the die 1 or the molding target 2 is heated from the pressure-receiving-stage-322 side, it is desirable to use a material like a metal having a high thermal conductivity. Conversely, when the die 1 or the molding target 2 is heated from the first-pressure-adjusting-room-30 side, it is fine if a material with a low thermal conductivity is applied in order to prevent heat from escaping to the pressure receiving stage 322, but in order to suppress an uneven heating, it is preferable that the pressure receiving face should be formed of a material having a high thermal conductivity. In an optical imprinting process, when alight source is disposed at the pressure-receiving-material-stage-322 side, it is appropriate if a transparent material like a glass is applied. In order to suppress a causing of unnecessary transfer trace on the molding target 2, the die 1 and the pressure receiving stage 322 may be formed integrally with each other. For example, according to conventional technologies, a pattern is formed by electroforming, and only the pattern portion is cut out and is utilized, but it can be directly used without a cut-out.

Figure 3:
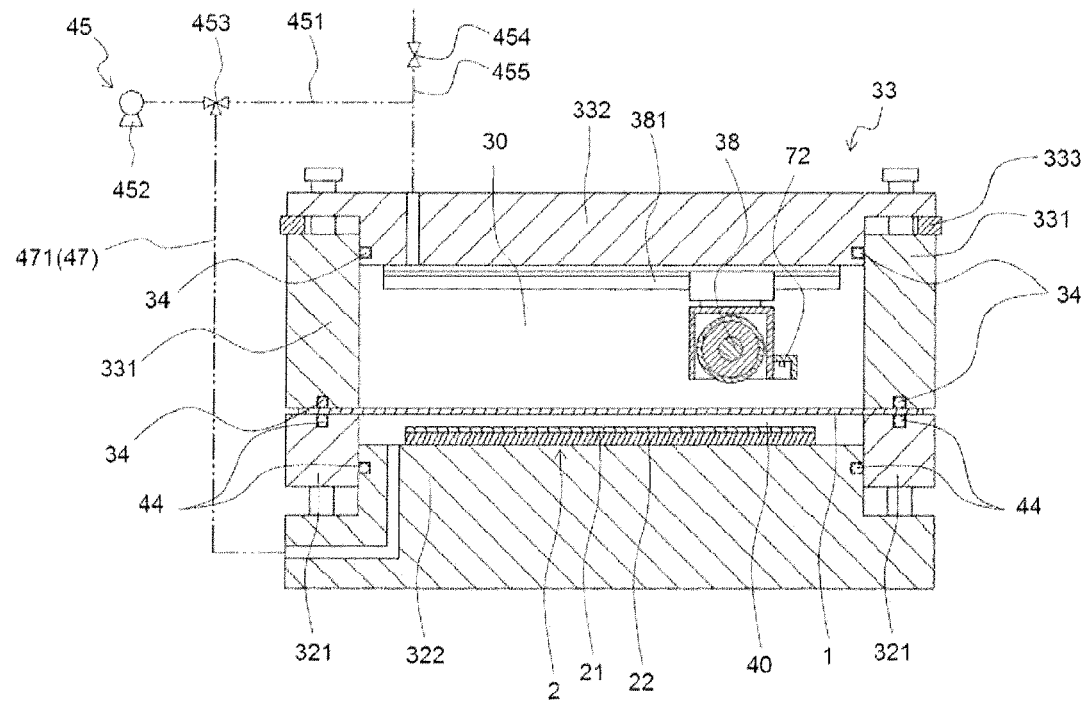
FIG. 3 is an end-face diagram illustrating the imprint device of the present disclosure.

In addition, it is fine if a second frame 321 which is movable relative to the pressure receiving stage 322 and which holds the die 1 or the molding target 2 together with the first frame 331 is provided. The second frame 321 may be formed in, for example, a cylindrical shape which encircles the pressure receiving stage 322 and which surrounds the outer circumference of the pressure receiving stage 322. By forming the second frame in this manner, as illustrated in FIG. 3, the second frame 321 is moved relative to the pressure receiving stage 322 to form a second pressure adjusting room 40. In this case, the second pressure adjusting room 40 is to depressurize the atmosphere between the die 1 and the molding target 2. Hence, gas present between the die 1 and the molding target 2 or between those and the pressure receiving stage 322 can be eliminated, allowing the die 1 and the molding target 2 to be uniformly depressed against each other. The material of the second frame 321 is not limited to any particular one as long as it has the pressure resistance and the heat resistance under a molding condition in an imprinting process, and for example, a metal like stainless-steel is applicable.

When the second frame 321 and the pressure receiving stage 322 are moved relative to each other, a second moving unit 46 is suitably provided. The second moving unit 46 can be any structure as long as it moves the first frame 331 and the second frame 321 close to or distant from each other, and for example, a hydraulic or pneumatic cylinder that moves the second frame 321 or a combination of an electric motor and a ball screw that move the second frame is applicable.

When no second frame 321 is provided, the pressure receiving stage 322 is formed in a size which can abut the first frame 331, and which can form the first pressure adjusting room.

In order to surely seal the second pressure adjusting room 40, a second pressure adjusting room sealer 44 to intimately seal a space between the second frame 321 and the pressure adjusting plate 332 and a space between the second frame 321 and the die 1 or the molding target 2 may be further provided. For example, as illustrated in FIG. 1, the second pressure adjusting room sealer 44 that is an O-ring is prepared, a concave groove shallower than the diameter of the cross-section of the O-ring is formed in the side end of the second frame 321 at the casing-33 side, and the O-ring can be disposed in this groove. In addition, a concave groove shallower than the diameter of the cross-section of the O-ring may be formed in the outer circumference (second-frame-321 side) of the pressure receiving stage 322, and the O-ring may be disposed in this groove. Needless to say, a concave groove shallower than the diameter of the cross-section of the O-ring may be formed in the inner circumference (pressure-receiving-stage-322 side) of the second frame 321, and the O-ring may be disposed in this groove.

In order to adjust the relative position of the roller 38 to the first frame 331 in the height direction, it is preferable to further provide a position adjuster 333. Hence, when the second pressure adjusting room 40 is formed, the lower end of the roller 38 is positioned at a location where no excessive force is applied to the die 1 or the molding target 2 held by the first frame 331 and the second frame 321, preferably, a location not contacting those. For example, it is appropriate if the position of the lower end of the roller 38 is set to be higher than the position of the lower end of the first frame 331 (see FIG. 3). Conversely, when the die 1 and the molding target 2 are superimposed and depressed by the roller 38, it is appropriate if the lower end of the roller 38 is adjusted to a location so as to contact the die 1 and to apply predetermined pressure to the die 1 and the molding target 2 (see FIG. 5).

An example position adjuster 333 is a spacer disposed between the pressure adjusting plate 332 and the first frame 331 as illustrated in FIG. 1. Another example position adjuster is an elastic body like a spring disposed between the pressure adjusting plate 332 and the first frame 331 although it is not illustrated in the figure. Hence, when there is no pressure difference between both faces of the pressure adjusting plate 332, the lower end of the roller 38 can be adjusted to a position not applying excessive force to the die 1 or the molding target 2 held by the first frame 331 and the second frame, more preferably, a position not contacting those by the spring force. Conversely, when a pressure difference is produced between both faces of the pressure adjusting plate 332, and counterforce equal to or larger than the elastic force by the elastic body is applied to the pressure adjusting plate 332, predetermined pressure can be applied to the die 1 and the molding target 2.

The pressure adjuster 45 is to adjust a pressure difference in fluid applied to both faces of the pressure adjusting plate 332. An example pressure adjuster 45 is a depressurizer that depressurizes the fluid pressure on the one surface of the pressure adjusting plate 332 or a pressurizer that pressurizes the fluid pressure.

When the depressurizer is utilized as the pressure adjuster 45, as illustrated in FIG. 1, in order to pressurize the die 1 and the molding target 2 by the roller 38, it is appropriate if, in the fluid pressures applied to both faces of the pressure adjusting plate 332, the pressure at the first-pressure-adjusting-room-30 side is adjusted so as to be relatively small. Hence, force produced by a pressure difference applied to the pressure adjusting plate 332 can be applied to the roller 38, and thus the pressurizing force by the roller 38 can be adjusted to a predetermined pressure.

When the pressurizer is utilized as the pressure adjuster 45, as illustrated in FIG. 9, in order to depress the die 1 and the molding target 2 by the roller 38, it is appropriate if, in the fluid pressures applied to both faces of the pressure adjusting plate 332, the pressure at the first-pressure adjusting room-30 side is adjusted so as to be relatively large. As will be described later, when the pressurizer is utilized as the pressure adjuster, the device becomes applicable to execute an intimate contact process and a fluid pressurizing process in an imprinting process.

As explained above, as the pressure adjuster 45, there are schemes of utilizing a depressurizer or a pressurizer, but as already discussed before, when the pressurizer is provided, a structure of supporting reactive force against the pressure force is necessary, and thus the device increases the size and costs. Accordingly, when the depressurizer is provided, there are advantages that the structure of the device can be simplified, and the costs can be reduced.

For example, as illustrated in FIG. 1, the depressurizer may include a first-pressure-adjusting-room gas supply/discharge channel 451 connected to the first pressure adjusting room 30, and a depressurizing pump 452 that discharges gas in the first pressure adjusting room 30 through the first-pressure-adjusting-room gas supply/discharge channel 451. In addition, in order to let the first pressure adjusting room 30 to return to the atmospheric pressure, an ON-OFF channel 455 is provided through an ON-OFF valve 454.

When the second frame 321 is provided to form the second pressure adjusting room 40, the pressure adjuster 45 is configured to be able to also adjust the pressure of the second pressure adjusting room 40. More specifically, the first pressure adjusting room 30 and the second pressure adjusting room 40 are depressurized to eliminate gas present between the die 1 and the molding target 2. Hence, when depressed by the roller 38, it becomes possible to prevent a transfer failure due to remaining gas between the die 1 and the molding target 2. It is preferable to provide a same-pressure adjuster 47 that adjusts the first pressure adjusting room 30 and the second pressure adjusting room 40 to be the same pressure. Hence, the die 1 or the molding target 2 present between the first pressure adjusting room 30 and the second pressure adjusting room 40 is not deflected due to a pressure difference, and the gas present between the die 1 and the molding target 2 can be surely eliminated. An example same-pressure adjuster 47 is a communication channel 471 that causes the first pressure adjusting room 30 to be in communication with the second pressure adjusting room 40. Such a structure can easily adjust the pressure of the first pressure adjusting room 30 and that of the second pressure adjusting room 40 to be the same pressure. The communication channel 471 may be provided in either one of the pressure receiving stage 322 or the second frame 321. In addition, as illustrated in FIG. 1, as a part of the communication channel 471, the first-pressure-adjusting-room gas supply/discharge channel 451 may be utilized through a three-way valve 453. As another example structure, the pressure difference between the first pressure adjusting room 30 and the second pressure adjusting room 40 may be adjusted based on pressure sensors that detect respective pressures of the first pressure adjusting room 30 and the second pressure adjusting room 40.

After the gas present between the die 1 and the molding target 2 is eliminated, the die 1 and the molding target 2 are superimposed, and the ON-OFF channel 455 is opened through the ON-OFF valve 454 to let the first pressure adjusting room 30 to return to the atmospheric pressure. Hence, the die 1 and the molding target 2 can intimately contact with each other.

Conversely, when the pressurizer is provided, as illustrated in FIG. 9, a pressurizing tank 456, etc., that supplies a fluid like compressed air to the first pressure adjusting room 30 of the pressure adjusting plate 332 may be utilized.

It is not illustrated in the figure but the imprint device of the present disclosure may include a fluid spray which sprays a fluid like gas between the die 1 and the molding target 2 and which is provided in the second frame 321. Hence, the casing 33 is moved apart from the pressure receiving stage 322 while holding the die 1 (or the molding target 2) with the first frame 331 and the second frame 321 to form a space between the end of the die 1 and that of the molding target 2 intimately contacting with each other, and the fluid is sprayed to this space, thereby demolding the die 1 from the molding target 2.

The fluid spray mainly includes, for example, a spray nozzle provided in the inner circumference side wall of the second frame 321, and spraying a fluid between the die 1 and the molding target 2, a flow-rate adjuster adjusting the flow rate of the fluid sprayed from the spray nozzle, a demolding fluid supply source supplying the fluid to the spray nozzle, and a demolding fluid supply channel for flowing the fluid from the demolding fluid supply source to the spray nozzle.

The spray nozzle may be slits formed along the inner circumference side wall of the second frame 321. The width of the slit can be adjusted in accordance with the sticking force between the die 1 and the molding target 2, but for example, a width of 0.2 to 05 mm is applicable. In addition, multi-nozzles having multiple ports provided at an appropriate pitch along the end of the molding target 2 are also applicable. The angle of the spray nozzle may be oriented with the direction of the intimately contacting faces between the die 1 and the molding target 2, or may be in parallel with the intimately contacting faces.

In addition, it is preferable that the spray nozzle should be provided in at least two directions facing across the molding target 2, more preferably, four directions. Hence, the fluids sprayed from the opposing positions collide at the center between the die 1 and the molding target 2. In this case, the fluid loses the speed, changes from dynamic pressure to static pressure, and the static pressure at the colliding location becomes higher than the pressure of the upper face of the molding target 2. Accordingly, the molding target 2 is lifted up. Hence, the energy of the sprayed fast-speed fluid is converted into static pressure, and thus the fluid that instantly eliminates peeling caused at the wall face, eddying flow, and shear stress prevents the pattern transferred on the molding target 2 from being, for example, damaged.

The flow-rate adjuster is not limited to any particular one as long as it can adjust the flow rate of the fluid sprayed from the spray nozzle, but for example, one adjusting the flow rate based on pressure and spray time is applicable. More specifically, a fluid pressurized at 0.2 to 0.5 MPa by an accumulator may be sprayed as pulses of 50 to 300 ms.

An example demolding fluid supply source is an air compressor supplying gas to the spray nozzle or a tank, etc., that reserves a compressed gas.

It is not illustrated in the figure but a temperature adjuster that adjusts the temperature of the molding target layer 21 by heating or cooling it may be further provided. Hence, the fluidity, etc., of the molding target layer 21 can be adjusted. When the imprint device of the present disclosure is applied to thermal imprinting, the molding target 2 can be heated to a temperature equal to or higher than the glass transition temperature, and depressed while the roller 38 is rolled to flatten the molding target layer. An example temperature adjuster is a heater that directly or indirectly heats the molding target layer 21 or a cooler that cools the molding target layer.

The heater is not limited to any particular one as long as it can heat the molding target layer 21 to a predetermined temperature, e.g., equal to or higher than the glass transition temperature or melting temperature of the molding target layer 21. In addition, the heater may heat the molding target layer 21 from the pressure-receiving-stage-322 side or from the first-pressure-adjusting-room-30 side. For example, a heater may be provided in the roller 38 or the pressure receiving stage 322 to heat the molding target layer 21 from the pressure-receiving-stage-322 side. Still further, a radiant heat source, such as a ceramic heater or a halogen heater, that emits electromagnetic waves to perform heating may be provided in the first pressure adjusting room 30 to heat the molding target layer 21. The molding target layer can be heated using a heated liquid or gas.

The cooler is also not limited to any particular one as long as it can cool the molding target layer 21 to a predetermined temperature. In addition, the cooler may cool the molding target layer 21 from the pressure-receiving-stage-322 side or from the first-pressure-adjusting-room-30 side. For example, a water jacket for cooling may be provided in the pressure receiving stage 322 to cool the molding target layer 21 from the pressure-receiving-stage-322 side.

When the imprint device of the present disclosure is applied to an optical imprinting process, it is appropriate if a light source 71 that emits electromagnetic waves with a predetermined wavelength to the molding target layer 21 is provided in the first pressure adjusting room 30 or the pressure receiving stage 322. In addition, the light source 71 can be disposed linearly in parallel with the roller at the back side in the moving direction of the roller when the roller makes the molding target layer 21 flat. According to this structure, the number of light sources 71 and the output can be reduced.

It is not illustrated in the figure but a carrier to carry the molding target 2 may be further provided. For example, a feeding roll that supplies the resin film (molding target 2) and a collecting roll that collects the resin film to which the mold pattern is transferred are disposed so as to face with each other across the pressure receiving stage 322. This structure enables a successive pattern transfer.

The explanation was given of an example case in which the roller-type depressing device of the present disclosure is applied to an imprint device that transfers the mold pattern of the die 1 to the molding target 2, but the roller-type depressing device is not limited to such an example application. For example, in a fluid depressing type imprint device that depresses the whole surface of the die with a fluid pressure, in order to push out and take out in advance bubbles present between the die 1 and the molding target 2, the roller-type depressing device is applicable.

Next, an explanation will be given of a roller-type depressing method according to the present disclosure. The roller-type depressing method of the present disclosure is to depress the object with the roller 38, and mainly includes a disposing process of disposing the object on the pressure receiving stage 322, a pressure adjusting process of adjusting the pressure applied by the roller 38 to the object by utilizing a fluid pressure difference applied to both faces of the pressure receiving plate 332 that supports the roller 38, and a depressing process of moving the roller 38 relative to the object, and depressing the object with the roller 38.

An explanation will be below given of a case in which the roller-type depressing device of the present disclosure is applied to imprinting together with an operation of the imprint device of the present disclosure. This imprinting is to transfer the mold pattern of the die 1 to the molding target 2, and mainly includes a disposing process of disposing the die 1 and the molding target 2 in a superimposed manner on the pressure receiving stage 322, a pressure adjusting process of adjusting the pressure applied by the roller 38 to the die 1 and the molding target 2 by utilizing a fluid pressure difference applied to both faces of the pressure receiving plate 332 that supports the roller 38, and a depressing process of moving the roller 38 relative to the die 1 and the molding target 2, and depressing the die 1 and the molding target 2 with the roller 38.

It is preferable that a depressurizing process of depressurizing the atmosphere between the die 1 and the molding target 2 should be provided before the disposing process. In addition, it is preferable that an intimate contact process of uniformly depressing the die 1 and the molding target 2 to let the die and the molding target to intimately contact with each other should be provided between the depressurizing process and the disposing process.

Figure 2:
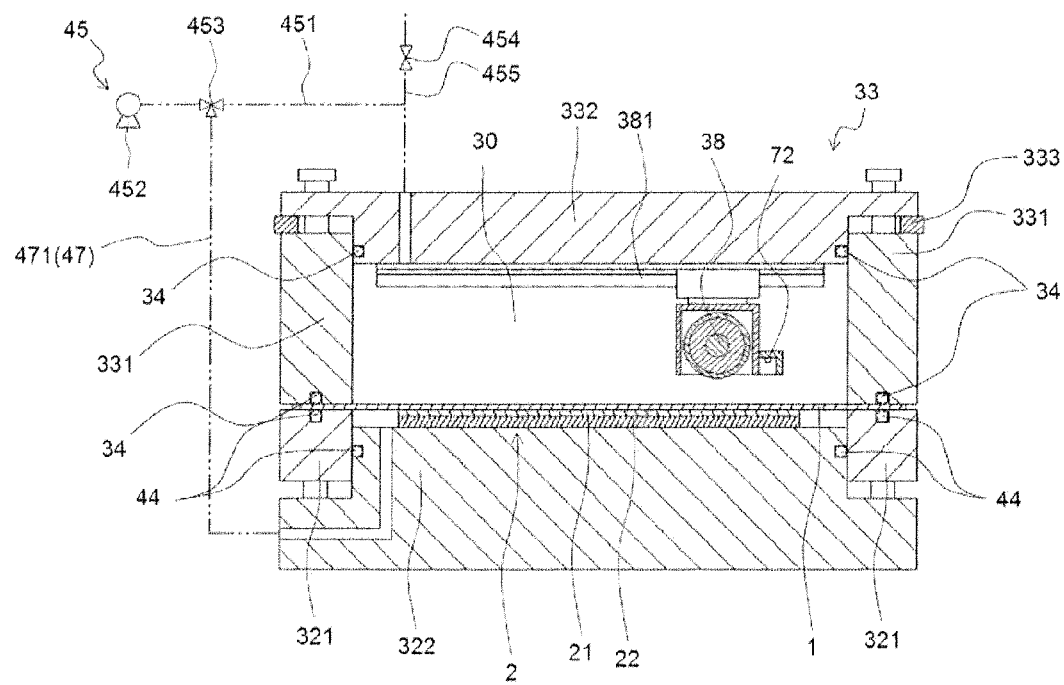
FIG. 2 is an end-face diagram illustrating the imprint device of the present disclosure.

In the depressurizing process, first, as illustrated in FIG. 2, the die 1 is held between the first frame 331 and the second frame 321, and as illustrated in FIG. 3, the pressure receiving stage 322 and the second frame 321 are moved relative to each other so as to form a space between the die 1 and the molding target 2, thereby forming the second pressure adjusting room 40. Next, the second pressure adjusting room 40 is depressurized by the depressurizer to eliminate gas present between the die 1 and the molding target 2. At this time, the first pressure adjusting room 30 is set to be the same pressure using the same-pressure adjuster 47, thereby preventing the die 1 held between the first frame 331 and the second frame 321 from being deflected.

In the disposing process, the pressure receiving stage 322 and the second frame 321 are moved relative to each other, and as illustrated in FIG. 2, the die 1 and the molding target 2 are disposed on the pressure receiving stage 322 in a superimposed manner.

Figure 4:
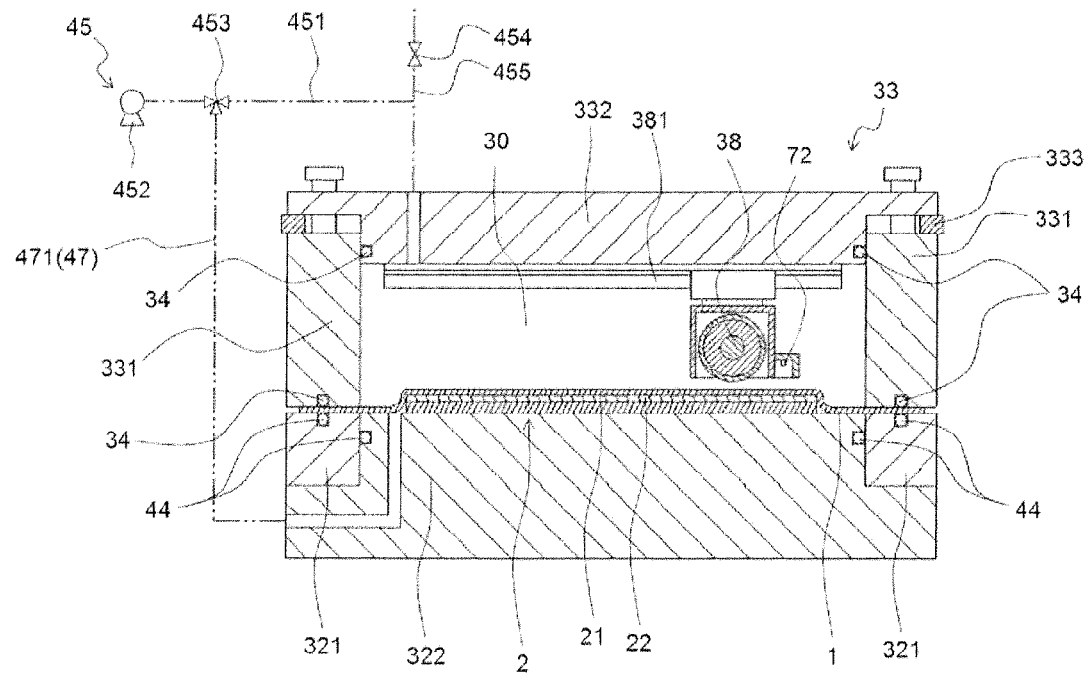
FIG. 4 is an end-face diagram illustrating the imprint device of the present disclosure.

In the intimate contact process, as illustrated in FIG. 4, the ON-OFF channel 455 is opened through the ON-OFF valve 454 to return the first pressure adjusting room 30 to the atmosphere pressure. Hence, pressure is applied to the die 1 and the molding target 2, thereby causing both to intimately contact with each other. When a pressurizer is provided, the die 1 and the molding target 2 may be caused to intimately contact with each other by increasing the pressure beyond the atmosphere pressure.

Figure 5:
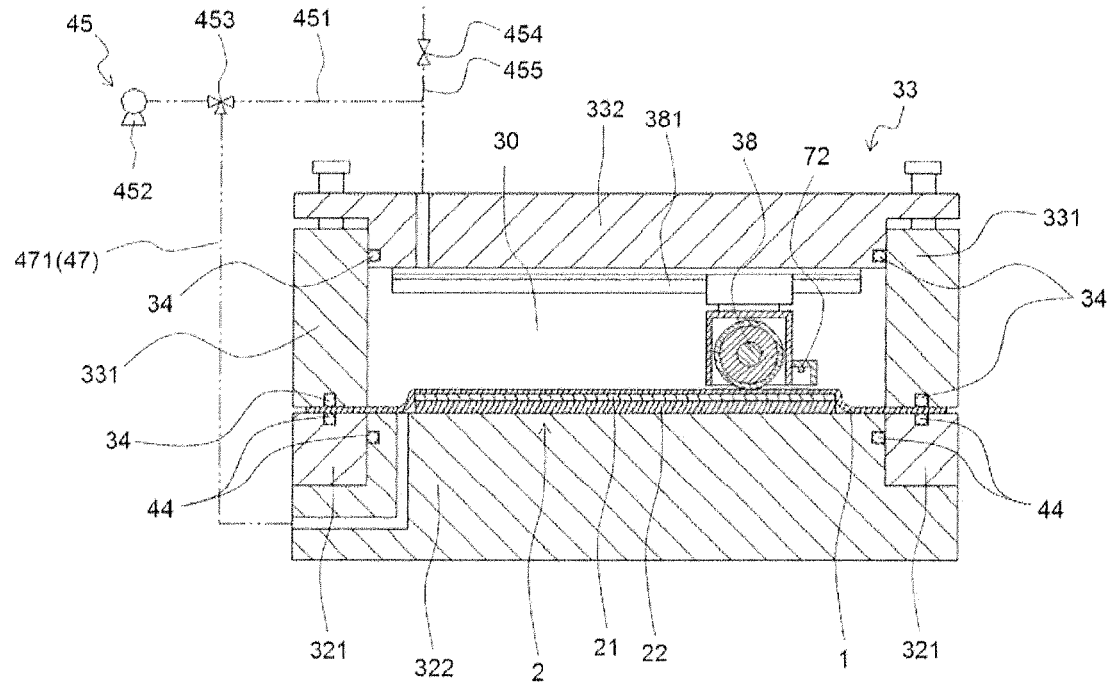
FIG. 5 is an end-face diagram illustrating the imprint device of the present disclosure.
Figure 6:
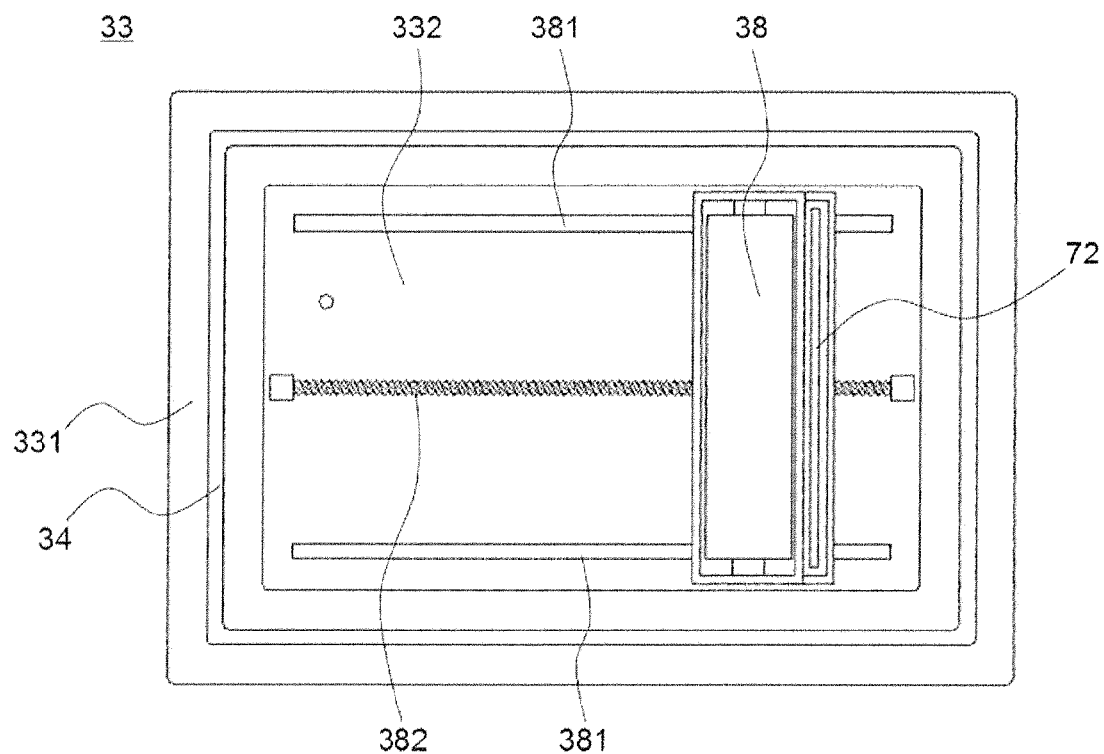
FIG. 6 is a plan view illustrating a casing of the imprint device of the present disclosure.

In the pressure adjusting process, as illustrated in FIG. 5, first, the spacer is taken out so as to position the roller 38 at a location where the roller can depress the die 1 and the molding target 2. Next, the first pressure adjusting room 30 is depressurized by the depressurizer. In this case, the pressure adjusting plate 332 is pushed toward the pressure receiving stage 322 by atmospheric pressure, and force produced by a pressure difference is applied to the roller 38. Hence, the die 1 and the molding target 2 can be depressed by the roller 38 at a constant force.

In the depressing process, the roller 38 is moved by the roller moving unit 381, and the die 1 and the molding target 2 are depressed at a constant pressure across the whole face. Note that when the pressurizer is provided, after the depressing process by the roller 38, a fluid depressing process of depressing the die 1 and the molding target 2 with a fluid may be further provided. Hence, the mold pattern can be further surely transferred.

When an optical imprinting is performed, light with a predetermined wavelength is emitted to the molding target layer 21 from the light source provided at the back side in the moving direction of the roller 38 while the roller 38 is moving along the guide rails (roller moving unit 381) to cure the molding target layer 21, thereby transferring the mold pattern to the molding target layer 21. When a thermal imprinting is performed, the molding target layer 21 is heated to a temperature equal to or higher than the glass transition temperature, is depressed by the roller 38, and cooled after the roller 38 moves out. For example, the roller heated to a temperature equal to or higher than the glass transition temperature may be rolled to heat and depress the molding target layer, and then the molding target layer may be cooled as needed.

A demolding process is not limited to any particular technique as long as the die 1 can be removed from the molding target 2, but for example, the casing 33 and the pressure receiving stage 322 are moved apart from each other to form a space between the die 1 and the molding target 2, and a fluid is sprayed to this space from the fluid spray provided in the second frame 321. Hence, the die 1 and the molding target 2 can be quickly removed from each other.

It is to be understood that additional embodiments of the present invention described herein may be contemplated by one of ordinary skill in the art and that the scope of the present invention is not limited to the embodiments disclosed. While specific embodiments of the present invention have been illustrated and described, numerous modifications come to mind without significantly departing from the spirit of the invention, and the scope of protection is only limited by the scope of the accompanying claims.

REFERENCE SIGNS LIST

1 Die
2 Molding target
30 First pressure adjusting room
33 Casing
38 Roller
40 Second pressure adjusting room
45 Pressure-adjusting-room sealer
45 Pressure adjuster
46 Second moving unit
72 Light source
321 Second frame
322 Pressure receiving stage
331 First frame
332 Pressure adjusting plate
333 Position adjuster
471 Communication channel

The invention claimed is:

1. A roller-type depressing device that depresses an object with a roller, the device comprising:
   a pressure adjusting plate provided with the roller;
   a roller moving unit that moves the roller relative to the object;
   a pressure adjusting unit that holds the pressure adjusting plate in such a way that a force produced by a pressure difference in fluid applied to both faces of the pressure adjusting plate acts on the roller;
   a pressure receiving stage that receives pressure of the roller via the object; and
   a pressure adjuster that adjusts the pressure difference in fluid applied to both faces of the pressure adjusting plate.

2. The roller-type depressing device according to claim 1, wherein the pressure adjusting plate is provided with the roller moving unit.

3. The roller-type depressing device according to claim 1, wherein the pressure adjuster comprises a first-pressure-adjusting-room component forming a first pressure adjusting room together with the pressure adjusting plate.

4. The roller-type depressing device according to claim 3, wherein the pressure adjuster comprises a depressurizer that depressurizes the first pressure adjusting room.

5. The roller-type depressing device according to claim 3, wherein the pressure adjuster comprises a pressurizer that pressurizes the first pressure adjusting room.

6. The roller-type depressing device according to claim 3, wherein the first-pressure-adjusting-room component is a cylindrical first frame that forms the first pressure adjusting room together with the object or the pressure receiving stage and the pressure adjusting plate.

7. An imprint device comprising the roller-type depressing device according to claim 1.

8. The imprint device according to claim 7, further comprising a light source which moves together with the roller and which emits light to the object.

* * * * *